United States Patent
Retelny, Jr.

(10) Patent No.: US 6,946,912 B2
(45) Date of Patent: Sep. 20, 2005

(54) MMIC DISTRIBUTED AMPLIFIER GATE CONTROL USING ACTIVE BIAS

(75) Inventor: Thomas J. Retelny, Jr., Rolling Meadows, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 38 days.

(21) Appl. No.: 10/690,090

(22) Filed: Oct. 21, 2003

(65) Prior Publication Data

US 2005/0083131 A1 Apr. 21, 2005

(51) Int. Cl.[7] .................................................. H03F 3/04
(52) U.S. Cl. ...................................... 330/296; 330/286
(58) Field of Search ................................. 330/285, 286, 330/296, 288, 307, 54; 323/315, 316

(56) References Cited

U.S. PATENT DOCUMENTS

| | | | | |
|---|---|---|---|---|
| 5,625,313 A | * | 4/1997 | Etoh ........................... | 327/486 |
| 6,326,849 B1 | * | 12/2001 | Wang et al. ................. | 330/310 |
| 6,492,874 B1 | * | 12/2002 | Shih ............................ | 330/288 |
| 6,861,908 B2 | * | 3/2005 | Gabillard et al. ........... | 330/310 |

* cited by examiner

*Primary Examiner*—Henry Choe
(74) *Attorney, Agent, or Firm*—Stetina Brunda Garred & Brucker

(57) ABSTRACT

An active bias is formed on a wafer which an electrical circuit is formed and produces a biasing voltage applied to an input signal which is additionally applied to the electrical circuit. In particular, the active bias may comprise at least one transistor, and is preferably, the same type of transistor forming the electrical circuit such that wafer lot variations affecting the electrical circuit may correspondingly affect the characteristics of the active bias. The active bias may comprise one field effect transistor with its drain electrically connected to the output of the electrical circuit. Additionally, the drain may be electrically connected to the gate of the transistor. In this regard, the current through the transistor may produce a voltage at the drain of transistor and respectively at the gate of the transistor. This voltage may then be applied to the electrical circuit as the biasing voltage. In this circuit, the current through the transistor will vary due to wafer lot variations and as a result, will correspondingly change the biasing voltage to be applied to the electrical circuit. The active bias may additionally comprise additional transistors wherein the channels of each transistor are electrically connected to the gates of the other transistor. In this regard, the current through the transistors are regulated by each other to prevent the transistors from having an excessive increase or decrease in current flowing therethrough.

6 Claims, 3 Drawing Sheets

MMIC DISTRIBUTED AMPLIFIER GATE CONTROL USING ACTIVE BIAS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention is generally related to a bias circuit which may provide a biasing voltage to biased circuit, and more particularly, is related to a bias circuit that may provide a biasing voltage that varies accordingly to changed characteristics of the biased circuit due to process variations.

FIG. 1 illustrates a distributed amplifier and a passive gate bias. The distributed amplifier is formed on a wafer, whereas the passive gate bias is formed on a circuit board which receives the distributed amplifier chip. Since the distributed amplifier is formed on a wafer, the distributed amplifier may have characteristics which may vary because of wafer lot to wafer lot variations. One such variation may be quiescent points of transistors which make up the distributed amplifier. To compensate for this variation, oftentimes, the passive gate bias is connected to the distributed amplifier. In the circuit shown in FIG. 1, the distributed amplifier receives an input signal at gates of the transistors. If the distributed amplifier was formed as designed and behaves as designed, then the input signal may not need to be biased. However, due to the wafer lot variations and the resulting differing characteristics in the amplifier, the input signal may need to be biased such that the transistors of the distributed amplifier operate at its quiescent point. As such, the passive gate bias is applied to the gates of the transistors to apply the biasing voltage to the input signal. In manufacturing, the distributed amplifier is tested during assembly to determine the amount of the wafer lot variation, and then the appropriate passive gate bias is selected to compensate for the variation. The passive gate bias shown in FIG. 1 is a resistive voltage divider and in this respect, appropriate resistor values are selected to compensate for the wafer lot variations. The purpose of the resistive voltage divider is to bias the input signal to the distributed amplifier such that the distributed amplifier may operate at its quiescent point.

This process of selecting proper resistors is very time consuming and inefficient in that at the least a statistical sampling must be done on the distributed amplifier of a particular wafer lot such that proper resistors are selected for the resistor voltage divider. Additionally, this process relies on a person to make a repetitive process which creates the possibility of error.

Accordingly, there is a need for an improved bias which may account for the wafer lot to wafer lot variations. As will be shown, an aspect of this invention is to design an active bias which is formed on the wafer which the distributed amplifier is formed on to thereby impart the wafer lot variations onto both the distributed amplifier and also the active bias.

BRIEF SUMMARY OF THE INVENTION

In an embodiment of the present invention, an active bias is provided which may be operative to apply a biasing voltage to an input signal. The input signal may then be applied to the input of a distributed amplifier. The biasing voltage which is applied to the input signal may be necessary such that the distributed amplifier may operate at its linearity point. The linearity point of the distributed amplifier occurs when an output signal of the distributed amplifier is linear in comparison to the input signal. If the biasing voltage was not applied by the active bias to the input signal then the input signal may have a peak or valley applied to gates of the distributed amplifier transistors which creates a situation where the channels of the transistors are pinched off such that there is an absence of an output signal or the channels of transistors of the distributed amplifier are saturated. If either the saturation or pinch-off situation occurs within the transistors of the distributed amplifier then the output signal may have a wave form wherein the peaks and valleys of the wave form are clipped off. The active bias which is the subject of the present invention is designed to reduce the possibility that the output signal is not linear with the input signal because of the possible pinch-off or saturation situation, as discussed above.

The active bias may comprise first, second and third resistors electrically connected to each other and to respective positive and negative voltage sources. The serially connected first, second and third resistors may additionally be connected to a first transistor which defines a gate, a source, and a drain. In particular, the drain of the first transistor may be electrically connected to the first and second resistor at their junction. The source of the first transistor may be electrically connected to a fourth resistor and subsequently to the negative voltage source, and the gate of the first transistor may be electrically connected to Rstability and subsequently electrically connected to the negative voltage source. In this regard, the current flowing through the first resistor is bifurcated through the drain and source of the first transistor. Additionally, this current is a function of the characteristics of the first transistor which is affected by the wafer lot variations when the active bias is formed on the wafer. When the wafer lot variations cause the transistors of the distributed amplifier to draw more current, the wafer lot variations will cause the first transistor to draw a corresponding amount of increased current. However, due to the circuitry or the electrical connections between the resistors and the first transistors, the increased draw of current through the first transistor will increase the current through the first resistor. Through basic ohm's law, the voltage drop across the first resistor is corresponding increased to correspondingly reduce Vout after the voltage drop across the second resistor. This voltage may be referred to as the biasing voltage and may be directly or indirectly applied to the input signal to properly bias the input signal such that the distributed amplifier may operate at its linearity point. This biasing voltage may have a negative or positive value. If a negative biasing voltage is desired, then a negative voltage should be applied to the second resistor with a positive voltage applied to the first resistor.

In an ideal state, the biasing voltage is easily predictable given set first, second and third resistors, first transistor and respective voltages. However, it is within the scope of the present invention that the active bias be formed on a wafer to account for wafer lot variations. As discussed in the background of the present invention, the above described components of the active bias when formed on the wafer may have variations from wafer lot to wafer lot. In this regard, although the components are formed on a wafer, the biasing voltage provided by the active bias may vary from wafer lot to wafer lot. Typically, this varying biasing voltage may not be useful to bias the input signal applied to the distributed amplifier. But, since the circuitry of the distributed amplifier which may include a plurality or at least one transistor that also varies in its characteristic from wafer lot to wafer lot, it has been found that the variations from wafer lot to wafer lot that affect the circuitry of the distributed amplifier proportionally affects the circuitry of the active bias. As such, although the biasing voltage provided by the active bias may vary, since the voltage or biasing voltage varies proportionally with respect to the distributed amplifier, the active bias may provide the biasing voltage or a proper biasing voltage to the input signal.

In another embodiment of the present invention, the active bias may comprise a first resistor, a first transistor which defines a gate, a source, and a drain, and a second resistor wherein the first resistor, the drain and source of the first transistor, and the second resistor are serially connected to each other. The gate of the first transistor may be electrically connected to drain of the first transistor, and in this regard, the voltage at the drain of the first transistor may be equal to the voltage at the gate of the first transistor. Through basic ohm's law, the voltage at the drain of the first transistor (i.e., the biasing voltage) may be designed with the proper biasing voltage corresponding to the distributed amplifier by careful selection of the values for the first resistor and the second resistor, first transistor having a selective characteristic, and the values for the voltages applied to the first resistor and the second resistor.

In another embodiment of the present invention, the active bias described in the prior embodiment may further include a second transistor. This second transistor defines a gate, a source, and a drain. The second transistor gate may be connected to the first transistor drain such that the channel of the second transistor is a function of the voltage at the drain of the first transistor. The drain of the second transistor may be connected to the positive voltage. And, the sources of the second and third transistors may be serially connected with a third resistor and a forth resistor, respectively, which are subsequently connected to the negative voltage. The circuitry described above switches the biasing current from the current that flows through the first transistor through the current that flows through the second transistor. In particular, the current that flow through the second transistor proceeds through the forth resistor. The source of the second transistor is connected between the fourth resistor and is the biasing voltage provided by the active bias to the input signal. The first transistor and the second transistor may have a p-type channel or a n-type channel, an excess current that flows through the first transistor may reduce the current through the second transistor so as to reduce the amount of current flowing through the first transistor by constricting the channel of the first transistor. Eventually, the active bias will settle to provide the proper biasing voltage.

The above described active bias having two transistors may further be improved with the following sink circuit, stabilizer circuit, and current source. The sink circuit may be at least one resistor and at least one diode serially connected to each other which are connected to the negative voltage. The sink circuit may additionally be connected to the biasing voltage and may be operative to sink any leakage current that may flow through or from the transistors of the distributed amplifier, specifically, through the gates of the transistors of the distributed amplifiers. The stabilizing circuit may be a capacitor connected serially to a resistor which in turn connects the gates and drains of the first and second transistors. In this regard, the stabilizing circuit eliminates any feedback elements so as to reduce the possibility that the circuit may oscillate. The current source may be third and fourth transistors having its sources connected to the third and fourth resistor which are respectively connected to the gates of their respective transistor and the negative voltage. In this regard, the transistors may not limit the amount of current that may flow therethrough. The drains of the current source may be connected to respective first transistor and second transistor. In this regard, the possibility of the first transistor and the second transistor shutting down is eliminated or reduced.

It has been found that the active bias has a circuit which may be a high-impedance circuit. In this regard, the positive voltage may be supplied by the output signal of the distributed amplifier prior to the blocking capacitor. Since the active bias is a high-impedance circuit, the active bias may be transparent to the output signal of the distributed amplifier. In other words, the load of the active bias is not sufficient to significantly affect the output signal.

In an aspect of the present invention, an electrical circuit is provided. The electrical circuit may comprise an amplifier circuit and an active bias circuit which are both formed on a wafer. The amplifier circuit may have a designed input biasing voltage for operating the amplifier circuit in an optimal range (e.g., linear range, etc.). The amplifier circuit may also have a required input biasing voltage offset to operate the amplifier circuit in the optimal range due to wafer lot variations.

The active bias circuit may be in electrical communication with the amplifier circuit. The active bias circuit may have a designed output biasing voltage and an actual output biasing voltage offset due to the wafer lot variations. The actual output biasing voltage offset may be proportional to the required input biasing voltage offset such that amplifier circuit operates in the optimal range, notwithstanding wafer lot variations.

BRIEF DESCRIPTION OF THE DRAWINGS

An illustrative and presently preferred embodiment of the invention is shown in the accompanying drawings in which.

DETAILED DESCRIPTION OF THE INVENTION

The drawings are for the purpose of illustrating the preferred embodiments of the present invention and not for the purpose of limiting the same. For example, in FIG. 1, a distributed amplifier 2 designed with pseudomorphic High Electron Mobility Transistors (pHEMT) 4 is shown. The pHEMT 4 may be connected to an active bias 10 which is an aspect of the present invention. Nonetheless, the active bias 10, the subject matter of the present invention, may be connected to other types of distributed amplifiers or electrical circuits designed with other types of transistors such as Bipolar Junction Transistors (BJT) and all of the various types of FETs and other similar components such as Junction Field Effect Transistor (JFET), Metal-Oxide-Semiconductor Field Effect Transistor (MOSFET), Metal-Semiconductor Field Effect Transistor (MESFET), High Electron Mobility Transistor (HEMT), and pseudomorphic High Electron Mobility Transistor (pHEMT).

Figure 1:
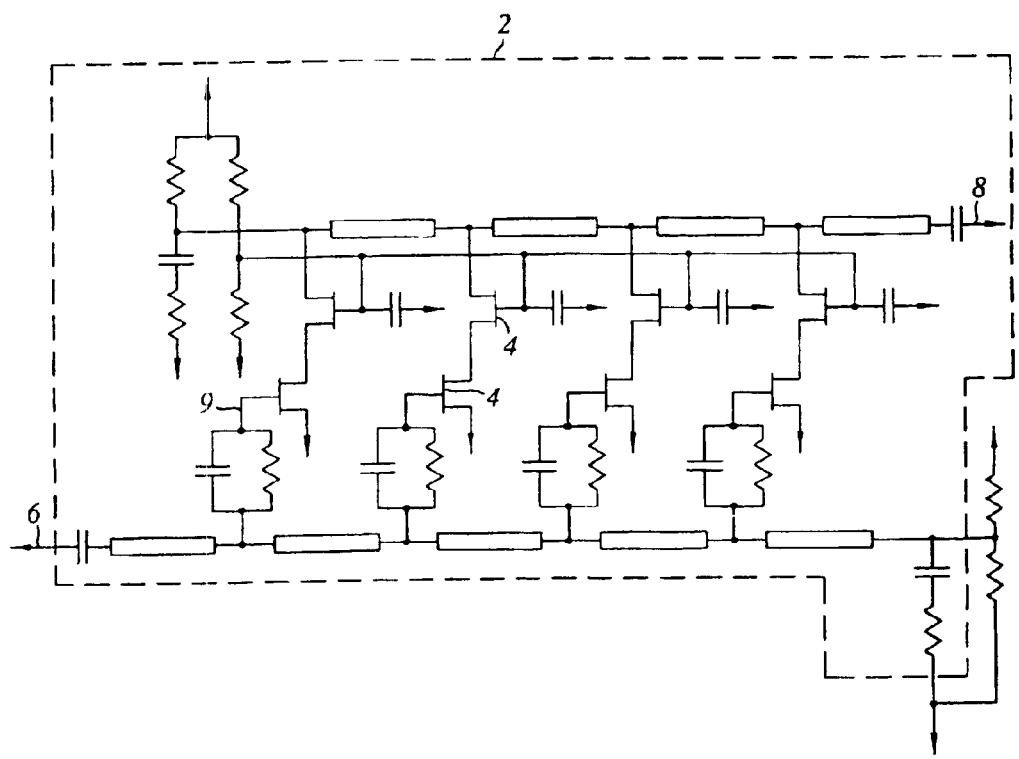
FIG. 1 illustrates a prior art distributed amplifier circuit which may be formed on a wafer and electrically connected to a passive gate bias formed on a circuit board which receives the wafer.

The following is a general description of the distributed amplifier 2 and its input and output signals 6, 8. The distributed amplifier 2, as shown in FIG. 1, may be a four stage distributed amplifier 2. Within each stage may be two pHEMT 4 in a cascode configuration. In particular, a drain of a first pHEMT may be connected to a source of a second pHEMT, and gates 9 of the first pHEMTs may receive an input signal. The input signal 6 may be applied to the gates 9 of the first pHEMTs within each stage. The distributed amplifier 2 may produce an amplified output signal 8 in relation to the input signal 6 at drains of the second pHEMTs of each stage. A blocking capacitor may be placed at the output 8 of the distributed amplifier 2 (i.e., after the fourth stage) to pass the output alternating current (AC) signal but block any direct current. The input and amplified output signals 6, 8 may be in the range of radio frequencies.

The distributed amplifier 2 may have a linearity point which is the point at which the output signal 8 is linear with the input signal 6. However, due to wafer lot variations, the linearity point of the amplifier 2 may vary and the input signal 6 may overdrive the distributed amplifier 2 such that the amplifier 2 may not behave linearly at certain instances. For example, the input signal 6 may have a peak voltage which is greater than the pinch off voltage, and in this instance, will produce an output signal 8 whose wave is at least partially clipped off. To compensate, the input signal 6 may be biased with a biasing voltage to bias the input signal 6 such that the distributed amplifier 2 may be operated at its linearity point and not be overdriven. Through experimentation, the distributed amplifier 2 shown in FIG. 1 may operate at its linearity point when the input signal 6 is biased with −0.4 volt. The −0.4 volts may be considered to be a designed biasing voltage which may be provided to the distributed amplifier 2 to bias the distributed amplifier 2 such that the same may operate at its linearity point. However, when the distributed amplifier 2 is formed on a wafer, the wafer lot variations may cause the distributed amplifier 2 to draw less current compared to a designed current. In this instance, the actual biasing voltage may be increased to a level greater than the designed biasing voltage. The designed biasing voltage may be considered to be the desired biasing voltage in an ideal state.

Figure 2:
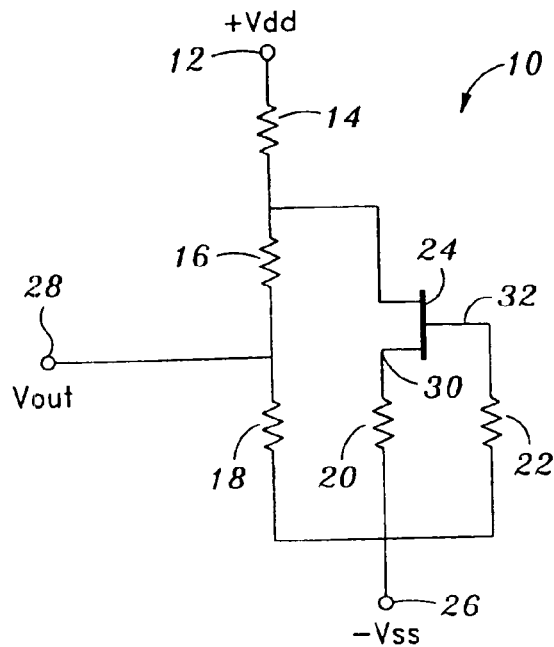
FIG. 2 illustrates an active bias formed on the wafer which the distributed amplifier shown in FIG. 1 is formed on to compensate for wafer lot variations.

FIG. 2 illustrates, which illustrates a first embodiment of the present invention, an active bias 10 which includes +Vdd 12, first, second, third and fourth resistors 14, 16, 18, 20, a stability resistor 22, and a first transistor 24. When the first transistor 24 draws a current, there is a voltage drop across the first resistor 14. The second and third resistors 16, 18 may behave as a resistive voltage divider whose values are selected based on the current through the first, second and third resistors 14, 16, 18, and the voltage of −Vss 26. The resistive voltage divider may provide the biasing voltage Vout 28 which may be subsequently applied to or in electrical communication with the gates of the distributed amplifier transistors. The voltage at a source 30 of the first transistor 24 may be set by the current through first resistor 14, fourth resistor 20 and −Vss 26. A gate 32 of first transistor 24 may be set at −Vss 26. The stability resistor may be a high value resistor connected in series to the gate 32 of the first transistor 24 to reduce the possibility of the first transistor 24 oscillating.

This active bias 10 may provide a biasing voltage (Vout) 28 to the input signal 6 applied to the distributed amplifier 2 such that the distributed amplifier 2 may operate at its linearity point. The $V_{out}$ 28 of the active bias 10 may be designed to produce a designed biasing voltage 28 by selecting the appropriate first, second, third and fourth resistors 14, 16, 18, 20 and including the stability resistor 22, in addition to providing the appropriate voltages +Vdd 12 and −Vss 26, and properly designing the first transistor 24. For example, the distributed amplifier 2 may be expected to draw current which may be referred to as a designed current draw. When the distributed amplifier 2 is formed on the wafer, the wafer lot variations may cause the distributed amplifier 2 to actually draw an increased or decreased amount of current compared to the designed current draw. It is this variation that the active bias 10 may compensate for such that the distributed amplifier 2 may operate at its linearity point. Even though there may be variations in the distributed amplifier 2 due to the wafer lot variations to require different biasing voltages, the active bias 10 may provide an appropriate increased or decreased biasing voltage (Vout) 28 as a function of the varying characteristics of the distributed amplifier 2. This compensation may be accomplished by forming the active bias 10 on wafer which the distributed amplifier 2 is formed such that the variations in the distributed amplifier 2 due to the wafer lot variations are also imparted onto the active bias 10. In particular, if the distributed amplifier 2 draws more current than designed then the active bias 10 may draw a corresponding amount of increased current and due to the circuitry of the active bias 10 may provide a proportionally reduced biasing voltage Vout 28 to the input signal 6. This provides the active characteristic of the active bias 10.

In use, the distributed amplifier 2 when formed on the wafer may draw an increased or decreased amount of current due to the wafer lot variations compared to the designed current draw. In the instance when more current is drawn through the distributed amplifier 2, the input signal 6 is preferably biased with a reduced biasing voltage 28 compared to the designed biasing voltage 28. In this regard, the active bias 10 of the present invention is designed to produce that reduced biasing voltage 28. This may be accomplished as stated above by forming the active bias 10 on the wafer which the distributed amplifier 2 is formed such that wafer lot variations affect the active bias 10 and the distributed amplifier 2 equally.

As shown in FIG. 2, the active bias 10 may be formed with the first transistor 24. And, more preferably, the first transistor 24 may be the same type of transistor compared to the transistors of the distributed amplifier 2 such that the wafer lot variations may affect the distributed amplifier 2 and the active bias 10 to the same degree. For example, if the distributed amplifier 2 draws more current when it is formed on the wafer compared to the designed current, then the first transistor 24 of the active bias 10 may draw more current compared to the designed current draw of the active bias 10. The circuitry of the active bias 10 causes the actual biasing voltage Vout 28 to be lower compared to the designed Vout 28 of the active bias 10. In particular, when the first transistor 24 draws more current, the current passing through the first resistor 14 may be greater than the designed current, and the voltage drop across the first resistor 14 may be greater than a designed voltage drop across the first resistor 14. This in turn will cause the resistive voltage divider to produce an actual biasing voltage 28, Vout less than the designed biasing voltage 28, Vout. The difference in the designed current through the first transistor 24 from the actual current flowing through the first transistor 24 may be proportionally matched to the difference in the designed biasing voltage 28 to the actual biasing voltage 28 that needs to be applied to the distributed amplifier 2 to properly operate the distributed amplifier 2 at its linearity point. This description of the active bias 10 was made in relation to the situation where the wafer lot variation causes the distributed amplifier 2 and the active bias 10 to draw more current compared to the designed current. The active characteristics of the active bias 10 in relation to the distributed amplifier 2 may operate reciprocally when the wafer lot variation causes the distributed amplifier 2 and the active bias 10 to draw less current compared to the designed current.

The −Vss 26 shown in FIG. 2 has a negative voltage. This negative voltage at −Vss 26 was required because the distributed amplifier 2 shown in FIG. 1 operates at its linearity point when the input signal 6 is biased with a negative voltage. However, the distributed amplifier 2 shown in FIG. 1 is for the purposes of illustration and not for the purpose of limiting the preferred embodiments of the present invention. As such, if a different distributed amplifier 2 requires a positive biasing voltage 28 for the distributed amplifier 2 to operate at its linearity point, then Vss may be grounded or have a positive voltage.

Figure 3:
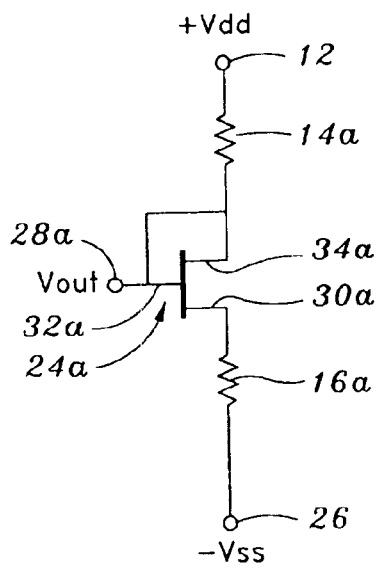
FIG. 3 illustrates an active bias with transistors similar to the transistors of the distributed amplifier such that the variations affecting the distributed amplifier due to wafer lot variations also affect the active bias.
Figure 4:
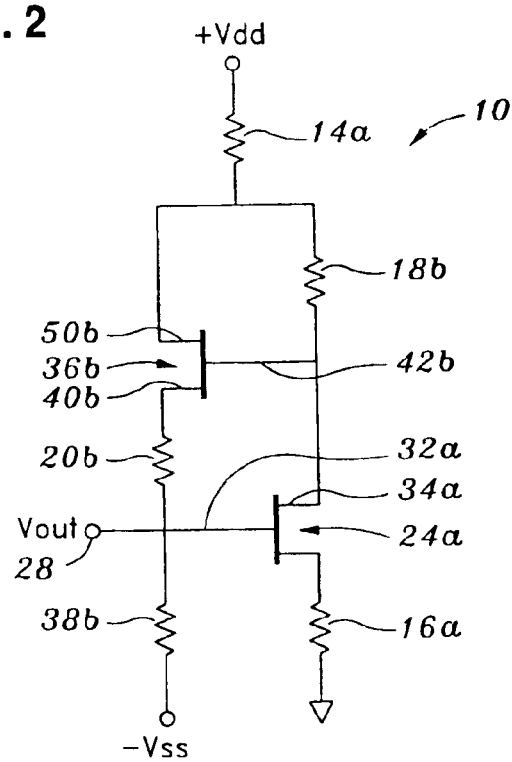
FIG. 4 illustrates the active bias with a Q2 transistor connected to the Q1 transistor to compensate for an extreme increase or decreased in currents through channels of Q1 and Q2 transistors.

Prior to discussing the second embodiment of the present invention which is illustrated in FIG. 4, the circuit shown in FIG. 3 will be discussed and subsequently contrasted with the first embodiment and the circuit shown in FIG. 4. In FIG. 3, the first transistor 24a is shown with its gate 32a and drain 34a in electrical communication with each other. Additionally, the drain 34a is electrically connected to a first resistor 14a and a positive voltage, +Vdd 12, and the source 30a is electrically connected to a second resistor 16a and a negative voltage, −Vss 26. In this circuit, when a current is drawn through the first transistor 24a, there is a voltage drop across the first resistor 14a which results in producing a voltage at the drain 34a of the first transistor 24a. Since the drain 34a and gate 32a are in electrical communication with each other, the voltage at the drain 34a of the first transistor may be applied to the input signal 6. This circuit is similar to the first embodiment of the present invention in that the current through the first transistor 24a may increase when the distributed amplifier 2 draws more current compared to the designed current. Additionally, due to the increased current draw, the voltage drop across the first resistor 14a increases and produces a lower biasing voltage Vout 28a. However, in this circuit, Vout 28 is highly sensitive to the value of the second resistor 16a whose resistance value changes due to process variation or heat. Additionally, if the current through the first transistor 24a due to wafer lot variations is excessive either in the positive or negative direction, the first transistor 24a may become damaged and fail to conduct any current therethrough. In this instance, Vout, the biasing voltage 28, may equal +Vdd 12 and cause damage to the distributed amplifier 2.

To reduce the likelihood of the failure of the first transistor 24a and to reduce the sensitivity of the biasing voltage 28a to the resistance value of the second resistor 16a, the circuit shown in FIG. 3 may be modified with a second transistor 36b and three resistors 18b, 20b, 38b. As shown in FIG. 4, the two transistors 24a, 36b are electrically connected to each other such that the source 40b of the second transistor 36b is electrically connected to the gate 32a of the first transistor 24a, and the drain 34a of the first transistor 24a is electrically connected to the gate 42b of the second transistor 36b. In this circuit, the current through the second transistor 36b provides the current which determines the biasing voltage 28 rather than a voltage drop across the first resistor 14a. As such, a high current or shut off condition is eliminated from the circuit shown in FIG. 3.

If when the active bias 10 is formed on the wafer the current through the second transistor 36b and the first transistor 24a is greater than the designed current, then the voltage drop across 18b will be greater than the designed voltage drop to produce a lower voltage at Vgate 42b of the second transistor 40b. This reduces the voltage at the source 40b of the second transistor and reduces the biasing voltage Vout 28. Additionally, the three resistors 20b, 38b, 18b may be selected such that the current through the second transistor 36b and the voltage at the source 40b of the second transistor 36b may be varied at a different rate than the first transistor 24a, thus providing appropriate biasing voltage 28 compensation over the wafer lot variation.

Figure 5:
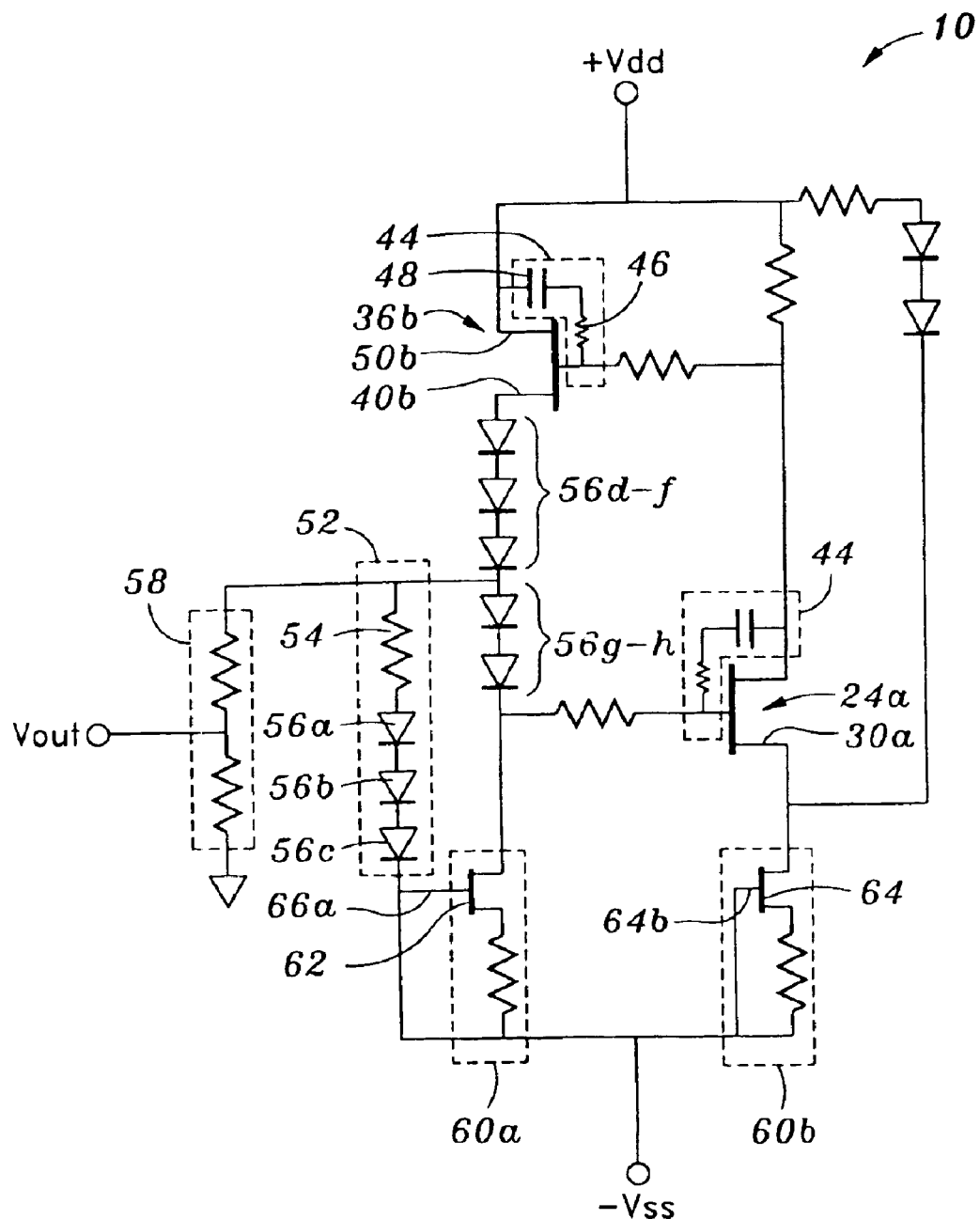
FIG. 5 illustrates the active bias of FIG. 3 with a stabilizing circuit and current sources to improve the stability of the active bias.

In another aspect of the present invention, a stabilizer circuit 44 may be connected to the active bias 10, as shown in FIG. 5. For example, the stabilizing circuit may comprise a resistor 46 and capacitor 48 connected in series between the gate 42b and drain 50b of the second transistor 36b. The stabilizer circuit 44 may be connected to each of the gates 42b, 32a and drains 50b, 34a of the second and first transistors 36b, 24a. This drains feedback elements on the second and first transistors 36b, 24a which limits the gain of the second and first transistors 36b, 24a and ensures the stability of the second and first transistors 36b, 24a.

In another aspect of the present invention, a sink circuit 52 may be connected to the active bias 10. The sink circuit 52 may be at least one resistor 54 and at least one diode 56a, 56b, 56c connected in series with one terminal connected to −Vss and the other terminal connected between the fourth and fifth resistor 20b, 38b. The sink circuit 52 may be operative to sink any current that may flow out from the transistors gates of the distributed amplifier 2. This transistor gate current may be characterized as including leakage current between the junctions of the transistor.

In another aspect of the present invention, the active bias 10 may be connected to a resistive voltage divider 58. This resistive voltage divider 58 is not selected as a function of the wafer variations of the distributed amplifier 2 as discussed in the background. Rather, this resistive voltage divider 58 may be additionally connected to the active bias 10 when the fourth and fifth resistors 20b, 38b are not capable of providing the proper biasing voltage 28. Hence, whereas the prior art passive bias in the form of a resistive voltage divider was a function of the wafer variations affecting the distributed amplifier 2, the resistive voltage divider 58 which is an aspect of the present invention may be a function of the active bias 10.

In another aspect of the present invention, the active bias 10 may be connected to current sources 60a, 60b. For example, the sources 40b, 30a of the second and first transistors 36b, 24a may be connected to third and fourth transistors 62, 64. These transistors 62, 64 may have its gates 66a, 66b connected to −Vss 26. In this regard, the channels of the third and fourth transistors 62, 64 may be wide open such that the full amount of current may flow through the channels to reduce the possibility that the second and first transistors 36b, 24a may not be turned off or pinched off.

Additionally, for the same reasons that current sources 60*a*, 60*b* may be connected to the active bias 10, the third and fourth resistors 20*b*, 38*b* of the active bias 10 shown in FIG. 4 may be replaced with diodes 56*d–f* and 56*g–h* to eliminate the possibility of excess build up of voltage on the source 40*b* of the second transistor 36*b*.

This description of the various embodiments of the present invention is presented to illustrate the preferred embodiments of the present invention, and other inventive concepts may be otherwise variously embodied and employed. The appended claims are intended to be construed to include such variations except insofar as limited by the prior art.

What is claimed is:

1. An active bias circuit for providing a biasing voltage to an electrical circuit formed on a wafer, the active bias circuit comprising first and second field effect transistors (FETs), each FET having a channel connected to a gate of the other FET to regulate an amount of current flowing through the channels of the first and second FETs, the current flowing through the second FET sets the biasing voltage at the gate of the first FET, the active bias circuit being formed on the wafer to proportionally compensate for variations in the electrical circuit and the active bias circuit as a result of wafer lot to wafer lot variations.

2. The active bias circuit of claim 1 wherein the first and second FET have a n-type channel.

3. The active bias circuit of claim 1 wherein an input of the electrical circuit is connected to the channels of the first and second FETs.

4. The active bias circuit of claim 3 wherein the output of the electrical circuit is a radio frequency signal.

5. An electrical circuit comprising:
 a. an amplifier circuit formed on a wafer having a designed input biasing voltage for operating the amplifier circuit in an optimal range, the amplifier circuit having a required input biasing voltage offset to operate the amplifier circuit in the optimal range due to wafer lot variations; and
 b. an active bias circuit formed on the wafer in electrical communication with the amplifier circuit, the active bias circuit having a designed output biasing voltage and an actual output biasing voltage offset due to the wafer lot variations, the actual output biasing voltage offset being proportional to the required input biasing voltage offset of the amplifier circuit such that the amplifier circuit operates in the optimal range, notwithstanding wafer lot variations.

6. The electrical circuit of claim 5 wherein the active bias circuit comprises:
 i) first and second field effect transistors (FETs), each FET having a channel connected to a gate of the other FET to regulate an amount of current flowing through the channels of the first and second FETs, the source of the second FET connected to the input of the amplifier to bias the amplifier with the biasing voltage;
 ii) wherein an actual current draw of the amplifier circuit and FETs of the active bias circuit is greater or less than the designed current draw of the amplifier circuit and FETS due to wafer lot variations, and the increased or decreased current draw through the first FET produces a lower or higher voltage, respectively, at the gate of the second FET to respectively reduce or increase the voltage at the source of the second FET such that the actual output biasing voltage of the active bias circuit has compensated for wafer lot variations.

\* \* \* \* \*